United States Patent [19]

Moss et al.

[11] 4,053,572
[45] Oct. 11, 1977

[54] PROCESS FOR PREPARING ESSENTIALLY PURE BARIUM FLUORIDE CRYSTALS

[75] Inventors: Robert H. Moss, Cleveland Heights; William F. Spicuzza, Eastlake, both of Ohio

[73] Assignee: The Harshaw Chemical Company, Cleveland, Ohio

[21] Appl. No.: 687,049

[22] Filed: May 17, 1976

[51] Int. Cl.$^2$ .................... C01F 11/22; C01F 11/36; C01F 11/18; C01F 11/38
[52] U.S. Cl. .................... 423/490; 423/430; 423/395
[58] Field of Search ............. 423/490, 430, 395, 397

[56] References Cited

U.S. PATENT DOCUMENTS

| 2,703,790 | 3/1955 | Anderson | 423/430 UX |
| 3,947,553 | 3/1976 | Moss et al. | 423/490 X |

FOREIGN PATENT DOCUMENTS

| 180,572 | 8/1966 | U.S.S.R. | 423/430 |

OTHER PUBLICATIONS

J. W. Mellor's, "A Comp. Treatise on Inorg. and Theo. Chem.", vol. 3, p. 688, Longmans, Green & Co.

Primary Examiner—Edward Stern
Attorney, Agent, or Firm—James A. Lucas; Alfred D. Lobo

[57] ABSTRACT

A malleable or press-forgeable ingot of barium fluoride, for use as an optical body, may be grown from an ultrapure precipitate of barium fluoride which contains less than 10 parts per million (ppm) of strontium or calcium. A process is disclosed for crystallizing barium nitrate crystals in the presence of nitric acid, reacting barium nitrate with ammonium carbonate to form barium carbonate, recovering barium carbonate crystals, suspending the barium carbonate crystals in water and precipitating barium fluoride with hydrofluoric acid. The barium fluoride crystals are recovered, dried and then calcined in the presence of ammonium fluoride or bifluoride. Barium fluoride ($BaF_2$) crystals obtained by the process of this invention contain less than 10 ppm of each strontium and calcium.

Crystals of an alkaline earth metal fluoride which have been calcined in the presence of a fluoride of ammonium are unexpectedly densified, and are particularly suited for melt-growth of an ingot in a known manner. A maximum concentration of 10 ppm of strontium and calcium in a $BaF_2$ ingot has been found to be the critical demarcation between a frangible prior art $BaF_2$ ingot and an ingot of $BaF_2$ which does not unpredictably shatter when cut, and, which may be reliably press-forged into an optical body.

1 Claim, No Drawings

PROCESS FOR PREPARING ESSENTIALLY PURE BARIUM FLUORIDE CRYSTALS

BACKGROUND OF THE INVENTION

The growth of large essentially single crystal ingots or macrocrystals of various inorganic salts for use as optical bodies has been the focus of much attention over the past decade. Among the salts especially suited for use as lenses over a wide range of wavelengths of radiation, are the alkaline earth metal halides. Most preferred are the fluorides of barium and calcium.

This invention is particularly directed to a barium fluoride ($BaF_2$) macrocrystal ingot because of its especially frangible nature. Ever since interest was sparked in $BaF_2$ optical bodies, it has been well-known that a relatively large ingot of $BaF_2$ will often shatter when being cut, sometimes with explosive force. Relatively small ingots, less than about 5 cms. in diameter, are less likely to shatter. The manner in which the ingot is cut appears to be irrelevant, as does the speed of cutting and other related factors. Despite taking ever conceivable precaution during the growth of a ingot of barium fluoride, there was no way of predicting whether or not the ingot could be cut without shattering, and there was no clue as to why an ingot shattered. Not unexpectedly, whether or not a melt-grown ingot of $BaF_2$ was malleable under sufficiently high temperature and pressure, was equally unpredictable. The enormous expense of growing a $BaF_2$ crystal ingot without being able to receive any assurance that the ingot will not shatter prematurely, fueled the efforts which results in the discovery that a concentration of strontium or calcium above about 10 ppm by weight was determinative of the malleability of the ingot. This invention is directed to a malleable $BaF_2$ ingot and to a process for obtaining an essentially strontium-free and calcium-free barium fluoride salt from which the ingot may be grown.

A macrocrystal or ingot of the present invention may be prepared by any conventional crystal growing technique for melt-growing an essentially single crystal ingot, such as the Stockbarger-Bridgman procedure (U.S. Pat. Nos. 2,498,186 and 2,149,076).

Prior art $BaF_2$ essentially single crystal ingots cannot be press-forged. They are not malleable. They shatter. Though a very large number of $BaF_2$ ingots have been melt-grown from substantially pure barium fluoride obtained from reagent grade barium salts, such as barium carbonate by reaction with hydrofluoric acid, the ingots were contaminated with an unacceptably high concentration of calcium or strontium or both carried over from the barium carbonate. For example, a typical reagent grade barium carbonate powder contains up to 0.30 percent (3000 ppm) strontium; typical reagent grade barium nitrate crystals contain up to 0.050% (500 ppm*) strontium. The commercially available pure barium nitrate contains up to 500 ppm each of strontium and calcium (AR grade $Ba(NO_3)_2$, Mallinckrodt 378a). Ingots melt-grown from such available starting materials therefore contained at least a strontium impurity in a concentration far higher than 10 ppm. Despite conventional purification of these commercially available crystalline powders, as for example, by several recrystallizations from solution, the purified salts failed to produce a predictably non-shattering ingot of $BaF_2$. It is conceivable that, with a large enough number of recrystallizations under suitable conditions, sufficiently contaminant-free $BaF_2$ cyrstals may be obtaind. The process of this invention is a practical alternative.

*see J. T. Baker Laboratory Chemicals and Products Catalog

It is recognized that crystalline barium fluoride powders essentially free of strontium may have been prepared for a specific purpose, but we are unaware of such ultrapure $BaF_2$ having been prepared by a wet process utilizing a concentrated nitric acid medium.

The difficulty of successfully separating barium salts from those of calcium and strontium is well-recognized even in known qualitative analytical procedures. For example, it is known that "The most satisfactory method of separating Ba from Ca and Sr is a double precipitation of barium chromate from a slightly acid solution containing ammonium acetate." (P. 298, Advanced Qualitative Analysis, by H. H. Willard and H. Diehl, Van Nostrand Co. Inc., N.Y. 1943). There is no indication however, as to how effectively trace amounts of Ca or Sr may be excluded from the barium chromate.

It is known that analytically pure $BaCl_2$ and $Ba(NO_3)_2$ can be decontaminated from Ca, Sr, Fe and other impurities with sequestering agents such as EDTA (ethylenediaminetetraacetic acid) solution (see "Purification of barium, strontium and calcium carbonates" by Nakhodnova A. P. et al., Zh. Prikl. Khim. 39 (3), 498–501, 1966, Russ.); by treating with $ZnCl_2$ (see "Purification of barium chloride solutions" by Akhmetov, T. G. et al., U.S.S.R. Pat. No. 262,104); and, by various ion exchange means.

More particularly a method is known for preparation of pure barium carbonate comprising dissolving crude $BaCO_3$ in a minimum of 18% aqueous HCl, precipitating $BaCl_2$, dissolving precipitated $BaCl_2$ in a minimum amount of water, redissolving and purifying the $BaCl_2$ with carbon, reprecipitating $BaCl_2$ redissolving in water, and precipitating $BaCO_3$ with $(NH_4)_2CO_3$ solution. The $BaCO_3$ so obtained is washed with hot water to remove chloride ions. To obtain pure $SrCO_3$, raw $CrCO_3$ is dissolved in 18% HCl, neutralized with ammonia and treated with active carbon. The solution is diluted with water and chromate solution added. The solution is decanted from $BaCrO_3$ ad some $SrCrO_4$ and $(NH_4)_2CO_3$ solution added. $SrCO_3$ obtained is filtered, washed with water and dissolved in a minimum of 18% aqueous HCl. To this solution is added 62–65% $HNO_3$ and $Sr(NO_3)_2$ is precipitated, filtered, washed with $HNO_3$ acid, and dissolved in a minimum amount of water. $SrCO_3$ is precipitated with $(NH_4)_2CO_3$ solution in the usual manner, filtered and washed with hot water to remove residual nitrate ions. (See "Preparation of pure barium and strontium carbonates" by Hradec Kralove, Chem. Prumysl 11, 129-31, 1961, Czech.) This use of nitric acid to precipitate strontium is contrary to the use of aqueous nitric acid to maintain strontium and calcium in solution, as is done in our invention.

As is apparent from the foregoing it is known that salts of barium, calcium and strontium are differently soluble in various liquid media. More specifically it is known that the solubilities of the nitrates of barium, calcium and strontium in aqueous solutions of nitric acid differ, and these solubilities have been measured for different concentrations of aqueous acid. The values obtained have been set forth in appropriate tables (Solubilities of Inorganic and Metal Organic Compounds, A. Seidell, Vol. I, D. Van Nostrand Co., Inc., New York, N.Y. 1940). However, the saturation tables define the behavior of a single salt in a particular medium and not the behavior of a mixture of salts. For example, these tables fail to indicate that a mixture of salts in a medium will crystallize as a coprecipitate of a solid solution of the salts. More particularly, these saturation tables are not indicative of whether or not the salts may be separated, one from another, without being coprecipitated and of course, cannot indicate the effectiveness with which a separation may be made.

It has been stated at the outset that this invention relates to a barium fluoride ingot which does not shatter when cleaved or cut, and which may be press-forged under appropriate conditions. What has not been stated is that it has been known for some time that the melt-growing of an inorganic salt ingot in a graphite crucible, whether or not it has less than the critical amounts of either calcium or strontium, is not possible if the salt is contaminated with traces of nitrate or nitrate ion. The presence of nitrate or nitrite ion in the $BaF_2$ salt in an amount lower than the detection level with diphenylamine will cause a graphite crucible, used for growing the $BaF_2$ ingot, to crack. It is therefore necessary, for growth in a graphite crucible, that the concentration of nitrate or nitrite ion be maintained well below 1 ppm. The problem of trace nitrate or nitrite contamination has been skirted in the past by utilizing $BaCO_3$ as a starting material, which is converted to $BaF_2$. Similarly $CaCO_3$ was used to obtain $CaF_2$. This problem does not arise in the melt growth of inorganic salts which may be effected in a crucible made of a non-graphitic material. For example, most of the ionic halides of the alkyl metals and the alkaline earth metals useful as optical bodies, may be readily obtained free of nitrate or nitrite ion, or, may be melt-grown in silica, alumina or platinum crucibles without contamination. The process of this invention comprising calcining an inorganic salt with an effective amount of ammonium fluoride and ridding the salt of nitrate or nitrite ion below the detectable level, permits using the calcined inorganic salt for growth of an ingot in a graphite crucible.

SUMMARY OF THE INVENTION

It has been discovered that an optically integral malleable barium fluoride ($BaF_2$) macrocrystal may be meltgrown from a melt of $BaF_2$ in which strontium (Sr) and calcium (Ca) impurities are each present in a concentration below about 10 parts by weight of elemental metal per million parts of melt, and the malleable macrocrystal may be press-forged into either an optical body or a thermoluminescent body without shattering.

It is therefore a general object of the instant invention to provide a press-forgeable macrocrystal of barium fluoride which may be deformed at a temperature below its melting point and under sufficient pressure, without shattering and without losing its optical integrity.

It has also been discovered that barium nitrte Ba($NO_3$)$_2$ crystals may be crystallized from an aqueous solution acidified with nitric acid without coprecipitating a deleterious amount of calcium or strontium.

It is therefore a general object of this instant invention to provide a wet process for obtaining ultra-pure crystals of Ba($NO_3$)$_2$ and $BaF_2$ which contain less than about 10 ppm each of calcium and strontium.

It is a specific object of the instant invention to provide a wet process for the separation of barium from all other metals, particularly calcium and strontium, which alkaline earth metals are normally present in small concentrations in a reagent grade barium salt.

It is a more specific object of the instant invention to provide a wet process to effect a highly refined separation of Ba($NO_3$)$_2$ from minute amounts of Sr($NO_3$)$_2$ and Ca($NO_3$)$_2$ using an aqueous nitric acid medium containing from about 1 percent to about 15 percent $HNO_3$.

It is another specific object of the instant invention to provide a process for the preparation of ultra-pure $BaF_2$ containing less than 10 ppm of either Ca or Sr from reagent grade Ba($NO_3$)$_2$ containing from about 50 ppm to about 500 ppm of Ca or Sr.

It is still another specific object of the instant invention to provide a process for the preparation of $BaF_2$ crystals essentially free of nitrate ions, from $BaCO_3$ crystals by reaction with HF acid, all of which crystals contain less than 10 ppm of either calcium or strontium.

It has also been discovered that ionic metal fluoride crystals contaminated with trace quantities of nitrate or nitrite ions, even below a concentration detectable with diphenylamine, may be cleansed of essentially all nitrate or nitrite ions by treating with a minor quantity of ammoniuum fluoride or ammonium bifluoride, in the range from about 1 to about 15 percent by weight, at a temperature above the sublimation temperature of the ammonium fluoride used.

It is therefore a general object of this invention to provide a process for removing a trace quantity of nitrate or nitrite ion from an ionic metal fluoride contaminated with deleterious nitrate or nitrite ions.

It is a specific object of this invention to provide a process for removing a trace quantity of nitrate or nitrite ion from an otherwise ultra-pure barium fluoride salt to be used for melt-growing a ingot in a graphite crucible.

It has also been discovered that precipitated fluorides of barium and magnesium are unexpectedly densified when calcined in the presence of ammonium fluoride or bifluoride.

It is therefore an general object of this invention to provide a process for increasing the bulk density of crystals of a precipitated alkaline earth metal fluoride cyrstalline powder by calcining the crystals in the presence of ammonium fluoride or bifluoride.

It is a specific object of this invention to provide an essentially moisture-free calcined barium fluoride powder having a bulk density from about 20 to about 60% greater than that of precipitated barium fluoride which is dried and conventionally calcined.

These and other objects, features and advantages of this process for preparing ultra-pure $BaF_2$ crystals, and of the malleable $BaF_2$ ingot melt-grown from these crystals, will become apparent to those skilled in the art from the following description of preferred forms thereof and the examples set forth herein.

DETAILED DESCRIPTION OF A PREFERRED EMBODIMENT OF THE INVENTION

This process for preparing ultra-pure, essentially calcium-free and strontium-free barium fluoride which contains less than 10 ppm by weight of either calcium or strontium, preferably utilizes as starting material a commercially available high-purity barium nitrate having less than about 100 ppm strontium and about 200 ppm calcium contaminants. Higher concentrations of calclium and strontium contaminants, up to about 5000 ppm (0.5 percent) in barium nitrate may be used, but Sr concentrations in excess of about 200 ppm typically necessitate multiple crystallizations to reduce Sr contamination to below 10 ppm. All references to contaminants in parts per million (ppm) are with respect to parts by weight of the elemental metal in a million parts of solid salt, on a dry basis.

Where the starting material is not barium nitrate, but a barium salt which may be converted to barium nitrate, for example, barium carbonate, barium hydroxide and the like, the salt is first converted to the nitrate and recovered in the solid form. Recovered barium nitrate is then processed as described hereinbelow, as would be a commercially available high-purity barium nitrate.

In a preferred embodiment of this invention, high-purity barium nitrate crystals contaminated with less than about 100 ppm strontium, and an approximately like or lower concentration of calcium, is dissolved in water to yield a concentrated aqueous solution of barium nitrate. To this solution is added sufficient concentrated nitric acid to form an acidified aqueous solution from which barium nitrate, $Ba(NO_3)_2$, crystals are obtained contaminated with less than about one-fortieth the concentration of strontium present in the starting barium nitrate crystals. Crystallization of barium nitrate from a $HNO_3$ acidified aqueous solution permits a manifold reduction factor of strontium contaminant in recovered barium nitrate crystals, the reduction factor obtained depending upon the concentration of strontium in the starting material, the concentration of acid in the solution, and the temperature of crystallizaton. The term "reduction factor" is used to define the ratio of the concentration of impurity in the starting material to the concentration of the same impurity in the purified material obtained. Thus, crystallization at room temperature from a barium nitrate solution containing 50 ppm strontium yields barium nitrate crystals having less than 5 ppm strontium in a 10% $HNO_3$ solution, exhibiting a reduction factor for Sr of more than 10; crystallization at room temperature from a barium nitrate solution containing 5000 ppm strontium yields barium nitrate crystals having less than 100 ppm strontium in a 10% $HNO_3$ solution, exhibiting a reduction factor for Sr of about 50. Higher reduction factors up to about 500 may be obtained with more impure barium nitrate at optimum acid concentrations and precipitation temperatures, and, lower reduction factors, as low as about 5, may be evidenced with highly purified material which is to be still further purified. From the foregoing it will be seen that essentially pure barium nitrate having less than 5 ppm strontium may be obtained with as few as two crystallizations, even with starting material having a relatively high concentration of strontium. Though lower temperatures and higher concentrations of nitric acid might appear to favor high reduction factors, it is found that an excessively high concentration of niric acid results in lower reduction factors. In other words, where the concentration of aqueous nitric acid is too high the concentration of strontium in the barium nitrate crystals is higher than it would have been had the acid concentration been less.

Essentially pure barium nitrate containing less than about 10 ppm of either calcium or strontium, obtained by crystallization from an aqueous nitric acid solution, as described hereinabove, is dissolved in water and conventionally converted to insoluble barium carbonate, $BaCO_3$, which precipitates from solution. This conversion of the $Ba(NO_3)_2$ in solution may be effected by bubbling carbon dioxide through an ammoniacal solution, adding chips of dry ice to an ammoniacal solution, or by adding ammonium carbonate. The barium carbonate so obtained is washed with distilled water until the wash water is free of all traces of nitrate or nitrite ion by the diphenylamine test. Though the wash water used to wash the $BaCO_3$ crystals gives a negative test for nitrate or nitrite ions, the $BaCO_3$ crystals retain trace quantities of these ions in a sufficiently high concentration to be transferred to other crystals derived from the $BaCO_3$ crystals.

Solid $BaCO_3$ contaminated with nitrate or nitrite ion is thereafter converted to $BaF_2$ by addition of hydrofluoric acid. The $BaF_2$ so formed is washed with water and dried. The dry $BaF_2$ is mixed with a small amount of ammonium fluoride or ammonium bifluoride in the range from about 5 to about 15 percent by weight, and heated to about 500° C in a nitrogen atmosphere, which effectively removes the traces of nitrate or nitrite ions. Thereafter the control temperature is set in the range from about 750° C to about 900° C and the crystals are calcined. An analogous procedure may be used for ridding any ionic metal fluoride of nitrate or nitrate ions; alkali metal fluorides, alkaline earth metal fluorides, and other fluorides useful as optical bodies or bodies with predetermined electrical properties, such as are highly sensitive to nitrate or nitrite ion contaminants, are particularly well adapted for ultra-purification by this method. The amount of ammonium fluoride used is not critical. Smaller amounts of ammonium fluoride may be effective, especially if multiple treatments are used. Though larger amounts of $NH_4F$ or $NH_4HF_2$ may be used, there is no economic reason for doing so. Optimum calcination temperatures will vary depending upon the salt but the temperature should be above the sublimation point of the ammonium fluoride used.

Those skilled in the art will recognize that the growth stock for an optically integral ingot is desirably free of associated moisture such as is present even after the salt crystals are dried conventionally at a temperature substantially in excess of 100° C. They will also be aware that removal of such moisture is often a most difficult task which is not accomplished successfully even at elevated temperatures above about 300° C. In some cases, as for example with $BaF_2$, prolonged heating in the presence of associated moisture at elevated temperatures results in the liberation of HF rather than the moisture only. The presence of ammonium fluoride or bifluoride intermixed with precipitated crystals of an alkaline earth metal fluoride permits the removal of associated moisture without decomposition of any $BaF_2$ to the oxide or oxyfluoride, and in addition effects the removal of nitrate and nitrite ion impurity.

Crystals of an alkaline earth metal fluoride which are obtained by precipitation from an aqueous solution, and conventionally dried at a temperature in the range from about 100° C to about 300° C have a flurry or soft appearance. This fluffy appearance, particularly compared to calcined crystals, is attributable to the large surface area of the particles and adsorbed gases on the particles. Typically, essentially all of a precipitated alkaline earth fluoride will pass through a U.S. Standard 200 mesh screen (74 microns), though it will be recognized that conditions of crystallization will affect crystal size.

Conventional calcination, that is heating the alkaline earth metal fluoride precipitated crystals in an inert or protective atmosphere, or in a vacuum, at a temperature substantially below the melting point of the crystals, will effect noticeable densification. Conventional calcination of precipitated alkaline earth metal fluoride crystals is generally effected in the temperature range from about 500° C to about 700° C, but below the sintering temperature of the crystals. By sintering temperature we refer to that temperature at which agglomeration of the crystals is initiated by crystal to crystal fusion, and which temperature is at least 100° C and preferably more than 200° C below the melting point of the crystals. The sintering temperature of precipitated $MgF_2$ crystals is about 800° C and, for $CaF_2$ crystals, may reach about 1000° C, with $SrF_2$ and $BaF_2$ crystals lying between $MgF_2$ and $CaF_2$. Though the crystals may be sintered at any temperature above the sublimation temperature of ammonium fluoride or bifluoride but below about 100° C less than their melting point, the presence of ammonium fluoride or bifluoride permits sintering to occur at a temperature lower than about 100° C. By densification, we refer to an increase in the bulk density of the precipitated crystals after they have been calcined. Surprisingly, however, the removal of nitrate or nitrite ion and associated moisture by calcining in the presence of ammonium fluoride or bifluoride also results in greater densification of precipitated ultrapure alkaline earth metal fluorides, particularly barium fluoride, calcium fluoride and magnesium fluoride crystalline powders, compared to densification obtained by conventionally calcining precipitated crystals. This densification is apparent by the marked reduction in the volume of the crystals, compared with that of a like weight of conventionally calcined crystals. Calcination in the presence of ammonium fluoride results in the removal of ammonium fluoride, but a very small weight change. Increased bulk density is noted for all alkaline earth metal fluorides when they are calcined at a temperature above the sublimation temperature of the ammonium fluoride used, but below the temperature at which the calcined crystals would be sintered, if ammonium fluoride or ammonium bifluoride was not present.

The presence of ammonium fluoride or ammonium bifluoride during calcination serves a dual purpose. It permits initiation of agglomeration of the crystals at a lower temperature, so that the surface area of the crystals is decreased and lessens adsorbed gas on the surface. In other words it permits sintering of the crystals at a lower temperature than would be required if ammonium fluoride was not present. It also protects the crystals from oxidation. However, crystals calcined in the presence of ammonium fluoride or ammonium bifluoride have a tendency to retain the bond of fusion required when the crystals are sintered. Though such a sintered mass of crystals may be used for melt-growing an ingot, it is preferred to crush the mass to obtain a more easily handled crystalline powder. This is preferably effected by crushing the sintered mass in a jaw crusher until a powder is obtained having crystals in the size range from about 1 micron to about 500 microns. For melt growing an ingot a crystalline powder in which from about 75 to 85% is held on a U.S. Standard 80 mess screen (175 microns) is preferred.

Even conventionally calcined crystals, particularly those calcined at relatively lower temperature in the range from about 500° C to about 700° C, may be densified by washing the calcined crystals with an aqueous solution of ammonium fluoride or bifluoride, drying the washed crystals and calcining the dried crystals in the presence of crystalline ammonium fluoride or bifluoride. For example, $BaF_2$ which has been conventionally dried and calcined at a temperature of about 500° C is throughly washed with an aqueous solution of ammonium fluoride containing about 10 percent by weight ammonium fluoride. The crystals are separated from the solution and dried at about 150° C. The dried crystals are then thoroughly mixed with finely divided ammonium fluoride crystals, present in an amount in the range from about 10 to about 15 percent by weight of the $BaF_2$ crystals, and calcined at a temperature of about 900° C. The bulk density of the ammonium fluoride treated calcined crystals is found to be about 30 percent greater than conventionally calcined $BaF_2$ crystals. In an analogous manner, densification of other conventionally calcined alkaline earth metal fluorides may be obtained, though the extent of densification will vary from about 10 to about 30 percent for different crystals.

Densification of the crystals is much valued because it permits a crucible to be loaded in a single operation prior to commencing growth of an ingot. Less dense crystals predicate added expenses for a furnace sized to accommodate a large crucible. Also, when an ingot is grown under vacuum, it is undesirable to interrupt a growth cycle to add more growth stock into the crucible as the material shrinks into an ingot. Still another alternative is to grow two ingots and then combine them in a "double slugging" operation. Densified crystals from our process offer a convenient and economical alternative.

Crystals of $BaF_2$ obtained as described hereinabove may be used to form a melt from which an ingot of essentially pure $BaF_2$ may be melt-grown utilizing conventional techniques. The melt-grown ingot is found to contain less than 10 ppm of either calcium or strontium, and surprisingly may be cleaved or sawn, predictably without shattering. The ingot or portions thereof may be used as optical bodies in a manner well-known to those skilled in the art.

Further, a melt-grown ingot of essentially pure $BaF_2$, obtained as set forth hereinabove, or a essentially single crystal portion of the ingot, is malleable and may be press-forged under suitable conditions of temperature and sufficient pressure, so as to undergo a transformation into a polycrystalline form without sacrificing the optical integrity of the archetype single crystal ingot. A suitable pres-forging temperature is below the melting point of the ingot but above about one-half its melting point measured in degrees centigrade. A preferred press-forging temperature is in the range from about 400° C to about 800° C. The pressure for press-forging an ingot of $BaF_2$ depends upon the temperature at which the ingot is worked to effect the transformation from monocrystalline to polycrystalline structure, and the deformation ratio desired, these factors being more fully described in U.S. patent application Ser. No. 307,939. A forging press may be required to develop high pressures up to about 10 tons per square inch. The pressure is preferably increased gradually and maintained until the hot crystal yields. In general, both the upper forging die and the lower forging dies are preheated to a suitable temperature so as not to cool the ingot to be press-forged.

Though it is preferred to use $Ba(NO_3)_2$ of suitable purity as a starting material, any other barium salt which may be converted to barium nitrate with concentrated nitric acid, may be used. For example, barium oxide, barium hydroxide and barium carbonate are commonly available barium salts which may be converted to barium nitrate and precipitated as such from an aqueous nitric acid soluton, thus obviating a preliminary recovery of barium nitrate crystals. From a practical point of view, $Ba(NO_3)_2$ crystals are generally available in better purity than other barium salts, and at a favorable price, so that the additional expenditure for nitric acid required to effect conversion to the nitrate is usually unjustifiable.

The following examples are by way of illustration only, and this invention is not limited by the particular data set forth therein.

EXAMPLE 1

Into a 55 gallon drum lined with a polyolefin liner and fitted with an agitator, is charged 10 kilos of $Ba(NO_3)_2$ crystals, reagent grade, having the following minimum standard analysis:

Assay ($Ba(NO_3)_2$): 99.0%
Insoluble Matter: 0.010%
pH of 5% Solution at 25% C: 5.0-7.0
Chloride (Cl): 0.0005%
Substances not Precipitated by $H_2SO_4$: 0.050%
Calcium (Ca): 0.050%
Heavy Metals (as Pb): 0.0005%
Iron (Fe): 0.0002%
Strontium (Sr): 0.050%.

Sufficient distilled water is added to the crystals to give a volume of 110 liters (29.1 gals.) of solution, and the contents of the drum are mixed until the crystals are in solution. The solution is filtered into another polyolefin lined drum to remove any insoluble material. To this filtered barium nitrate solution is gradually added 12.2 liters of reagent concentrated nitric acid (about 70% $HNO_3$), while stirring. It is preferred to keep the solution relatively cool and it is desirable to maintain a temperature at about room temperature or below, where a high reduction factor for strontium impurity is desired in a single crystallization step. Where strontium impurity is about 200 ppm or less, room temperature crystallization suffices. A mass of crystals precipitates from the solution, leaving a clear acidic mother liquor.

The mother liquor is decanted and the crystals placed in a Buchner funnel in which additional liquid is separated from the crystals. These crystals are then dissolved in about 55 liters of distilled water while the mixture is heated to about 80° C to facilitate dissolution of the crystals.

Prepare a solution of 8.6 kilos of $(NH_4)_2CO_3$ in about 50 liters of distilled water, filter and heat to about 60° C in a suitable container. Add the heated barium nitrate solution to the ammonium carbonate solution, stirring constantly under adequate ventillation. Thereafter add sufficient $NH_4OH$ to bring the pH in the range from about 8.5 to about 9.0, and separate precipitated barium carbonate from the mother liquor. The $BaCO_3$ precipitate is repeatedly washed until the wash water from the crystals is free of nitrate or nitrite ion as indicated by an absence of blue coloration in an acidified sample of wash water in the presence of diphenylamine. The washed $BaCO_3$ is slurried in hot water and reacted with reagent grade HF to form $BaF_2$ crystals which are separated from the supernatent liquid. The crystals are washed with water containing a small amount less than about 10% by weight of ammonium fluoride, and preferably from about 1 to about 5% by weight of ammonium fluoride in water. The wash solution tests slightly acidic, the pH being in the range form about 3 to about 5. The crystals are sucked dry in a Buchner funnel, placed in a tray and dried at about 150° C in a conventional convection oven. The dried crystals are then calcined with about 10% by weight $NH_4F$ under nitrogen for about 12 hours during which the temperature of the crystals is gradually increased to about 900° C. The calcined crystals are permitted to cool. The crystals contain less than 10 ppm strontium impurity, and less than 10 ppm Ca impurity.

EXAMPLE 2

An analogous procedure to that described in Example 1 hereinabove, is followed, except that the starting material is barium carbonate having about 5000 ppm of strontium and an approximately like amount of calcium. A stoichiometric amount of 70% $HNO_3$ acid is added to an aqueous slurry of $BaCO_3$ so as to obtain a solution of $Ba(NO_3)_2$ in water. The solution is filtered and additional nitric acid is added to yield a solution containing from about 10% to about 15% $HNO_3$ so that $Ba(NO_3)_2$ crystals are precipitated from the solution. The supernatant liquid, contains most of the strontium and calcium impurities present, and is discarded. The $Ba(NO_3)_2$ crystals obtained are dissolved in distilled water and reagent grade conc. $HNO_3$ is added to the solution, so that $Ba(NO_3)_2$ crystals are again precipitated from solution. The crystals obtained contain less than 10 ppm of either strontium or calcium. The supernatant liquid from the second crystallization contains a relatively low concentration of strontium and calcium and may be reused to convert additional $BaCO_3$ to $Ba(NO_3)_2$, thus effecting a economy of acid.

The essentially pure barium fluoride crystals, containing less than 10 ppm of calcium or strontium, obtained in Examples 1 and 2 hereinabove are used separately to melt-grow ingots of $BaF_2$ in conventional Stockbarger growth furnaces. The ingots obtained are cut into numerous smaller portions by cleaving or by sawing, and no shattering of an ingot, or a portion thereof, was recorded. Prior experience with ingots having greater than about 10 ppm strontium or calcium shattered unpredictably. There appears to be no readily recognizable correlation between the concentration of strontium or calcium above the 10 ppm level, and, either the risk of shattering or the explosive force with which an ingot may shatter. It is concluded that maintaining a concentration of strontium and calcium impurities below about 10 ppm each is the critical difference between relatively large ingots which unexpectedly shatter and those which predictably do not. As mentioned hereinbefore, ingots smaller than about 5 cms. in diameter are not affected as dramatically by impurities of Ca or Sr in excess of 10 ppm.

EXAMPLE 3

The procedure set forth in Example 1 hereinabove is used to obtain $BaF_2$ crystals. A first portion of the $BaF_2$ crystals are washed with an aqueous ammonium fluoride solution. An equivalent second portion of $BaF_2$ crystals are washed with distilled water. Each portion is then dried at 150° C in a convection oven.

One liter of the dried crystals of the second portion washed in distilled water is calcined conventionally the maximum temperature attained being about 900° C.

One liter of the dried crystals of the first portion washed with an aqueous ammonium fluoride solution is calcined in the same way as the second portion, except that these crystals have interspersed therewithin about 10 percent by weight of finely divided ammonium fluoride crystals, which for the most part, occupy voids within the crystalline mass of $BaF_2$ crystals. As in the conventional calcination, the maximum temperature attained is about 900° C.

It is observed that the volume of the calcined first portion is reduced to about 0.5 liter. The volume of the conventionally calcined second portion is reduced to 0.75 liter.

In a manner analogous to that described hereinabove, it is found that precipitated $CaF_2$ crystals calcined in the presence of about 10 percent ammonium fluoride interspersed within the mass of crystals are about 50% denser than conventionally calcined precipitated $CaF_2$ crystals, i.e., the bulk density is about 50% greater than conventionally calcined crystals.

Modifications, changes and improvements to the preferred forms of the invention herein disclosed, described and illustrated may occur to those skilled in the art who come to understand the principles and precepts thereof. Accordingly, the scope of the patent to be issued hereon should not be limited to the particular embodiments of the invention set forth herein, but rather should be limited by the advance by which the invention has promoted the art.

What is claimed is:

1. A wet process for preparing essentially pure barium fluoride crystals comprising:
   a. dissolving barium nitrate in water to form an aqueous solution;
   b. adding nitric acid to said aqueous solution to form an acidic solution, the concentration of said acidic solution being in the range from about 1 percent to about 15 percent $HNO_3$;
   c. crystallizing barium nitrate crystals from said acidic solution, in which crystals either calcium or strontium element is coprecipitated as a salt in an amount less than 10 parts each per million parts by weight of said barium nitrate crystals;
   d. converting said barium nitrate crystals to barium carbonate;
   e. cleansing said barium carbonate by washing with water until the wash water gives no indication of nitrate or nitrite ions, and;
   f. converting said barium carbonate to said barium fluoride crystals having less than 10 parts each of calcium or strontium present as a fluoride per million parts by weight of barium fluoride.

* * * * *